(12) United States Patent
Murakami et al.

(10) Patent No.: US 6,468,102 B1
(45) Date of Patent: Oct. 22, 2002

(54) METHOD OF MANUFACTURING WIRING BOARD, AND ELECTRIC CONNECTION BOX

(75) Inventors: Masakazu Murakami; Mitsuo Tanaka; Tatsuo Satori, all of Hikone (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 296 days.

(21) Appl. No.: 09/593,004

(22) Filed: Jun. 13, 2000

(30) Foreign Application Priority Data

Jun. 17, 1999 (JP) .......................................... 11-171065

(51) Int. Cl.[7] ................................................ H01R 4/24
(52) U.S. Cl. ....................................... 439/404; 439/402
(58) Field of Search ................................ 439/404, 402, 439/941, 44, 48, 76.2; 29/832

(56) References Cited

U.S. PATENT DOCUMENTS

| | | | | |
|---|---|---|---|---|
| 4,533,201 A | * | 8/1985 | Wasserlein, Jr. | ............ 439/391 |
| 4,552,429 A | * | 11/1985 | van Alst | ...................... 439/392 |
| 5,501,605 A | * | 3/1996 | Ozaki et al. | .............. 174/72 A |
| 5,722,851 A | * | 3/1998 | Onizuka et al. | ............ 439/402 |
| 5,778,528 A | * | 7/1998 | Saka et al. | ..................... 29/850 |

\* cited by examiner

*Primary Examiner*—Neil Abrams
*Assistant Examiner*—Phuong K T Dinh
(74) *Attorney, Agent, or Firm*—Oblon, Spivak, McClelland, Maier & Neustadt, P.C.

(57) ABSTRACT

Disclosed are a method of manufacturing a wiring board, and an electric connection box manufactured by retaining the manufactured wiring board in a case. The method comprises the steps of winding electric wires around an insulating plate in first and second directions different from each other; cutting the electric wires at a first desired position; connecting the electric wires at a second desired position where the electric wires cross each other; and attaching a connecting terminal to the electric wires at a third desired position.

6 Claims, 8 Drawing Sheets

METHOD OF MANUFACTURING WIRING BOARD, AND ELECTRIC CONNECTION BOX

BACKGROUND OF THE INVENTION

1. Field of the Invention

The present invention relate s to a method of manufacturing a wiring board and an electric connection box which uses a wiring board manufactured by this method.

2. Description of Related Art

Conventionally, an electric connection box was manufactured by attaching various bus bars, acquired by punching copper bars into desired circuit patterns, to an insulating plate or placing those bus bars between a plurality of insulating plates to thereby form a wiring board, an d housing this wiring board into a case.

Naturally, the conventional electric connection box using bus bars requires multiple molds which are adapted to all kinds of bus bars and result in a high manufacturing cost. When some design change demands an alteration in circuits, all the molds should be constructed again, which makes it hard for the conventional electric connection box to be adapted to a change in circuit design.

SUMMARY OF THE INVENTION

An object of the present invention is to provide a method of manufacturing a wiring board and an electric connection box, which do not use bus bars that require molds and are thus inexpensive and which can easily be adapted to a change in circuit design.

To achieve the above object, a method of manufacturing a wiring board according to this invention comprises the steps of winding electric wires around an insulating plate in first and second directions different from each other; cutting the electric wires at a first desired position; connecting the electric wires at a second desired position where the electric wires cross each other; and attaching a connecting terminal to the electric wires at a third desired position.

It is preferable that the insulating plate should be formed of polypropylene or polybutylene terephthalate which has an electric insulating property.

It is also preferable that the insulating plate should have multiple retaining grooves for retaining electric wires, formed in a periphery at predetermined pitches, and terminal grooves, provided in the retaining grooves, to which pressure-contacting terminals are to be attached.

To achieve an object of this invention, an electric connection box according to this invention is manufactured by housing a wiring board manufactured by the above-described method in a case.

It is preferable that the case should have an upper case and a lower case.

According to the present invention, there are provided a method of manufacturing a wiring board and an electric connection box, which do not use bus bars that require molds and are thus inexpensive and which can easily be adapted to a change in circuit design.

The aforementioned object of this invention, together with other objects, features and advantages thereof, will be readily apparent from the following description with reference to the accompanying drawings.

DETAILED DESCRIPTION OF THE PREFERRED EMBODIMENTS

Preferred embodiments of a method of manufacturing a wiring board and an electric connection box according to the present invention will now be described referring to FIGS. 1 through 13.

Figure 1:
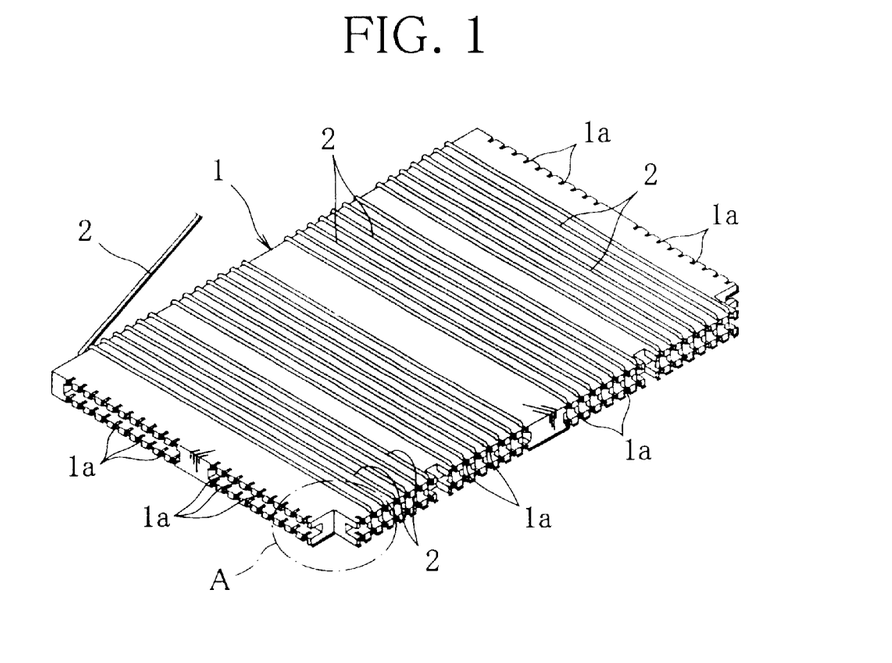
FIG. 1 is a perspective view showing electric wires wound around an insulating plate in a first direction, which is used in a method of manufacturing a wiring board according to this invention.

The wiring-board manufacturing method of this invention uses an insulating plate 1 shown in FIG. 1, which is formed of polypropylene (PP), polybutylene terephthalate (PBT) or the like and has an electric insulating property.

Figure 2:
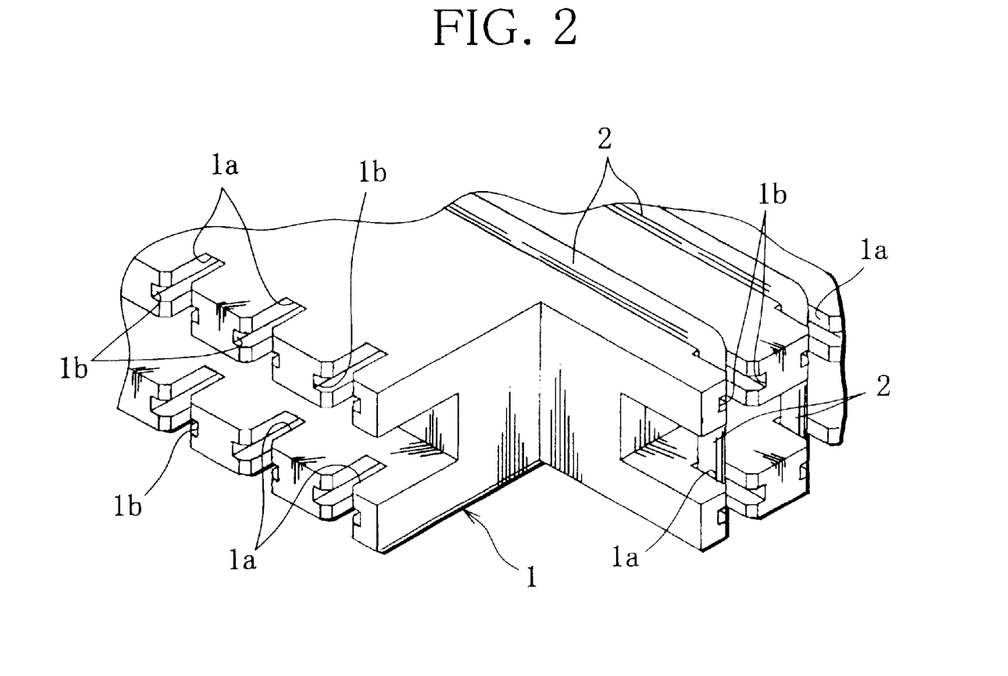
FIG. 2 is a perspective view showing a portion A of the insulating plate in FIG. 1 in enlargement.

As shown in FIGS. 1 and 2, the insulating plate 1 is formed rectangular and has multiple retaining grooves 1a for retaining electric wires 2, formed in the edges on three sides at predetermined pitches, and terminal grooves 1b (see FIGS. 2 and 7), provided in the respective retaining grooves 1a, to which pressure-contacting terminals 3 are to be attached.

In manufacturing a wiring board, first, the electric wires 2 are wound around the insulating plate 1 in the widthwise direction using the multiple retaining grooves 1a on the long side, as shown in FIG. 1.

Figure 3:
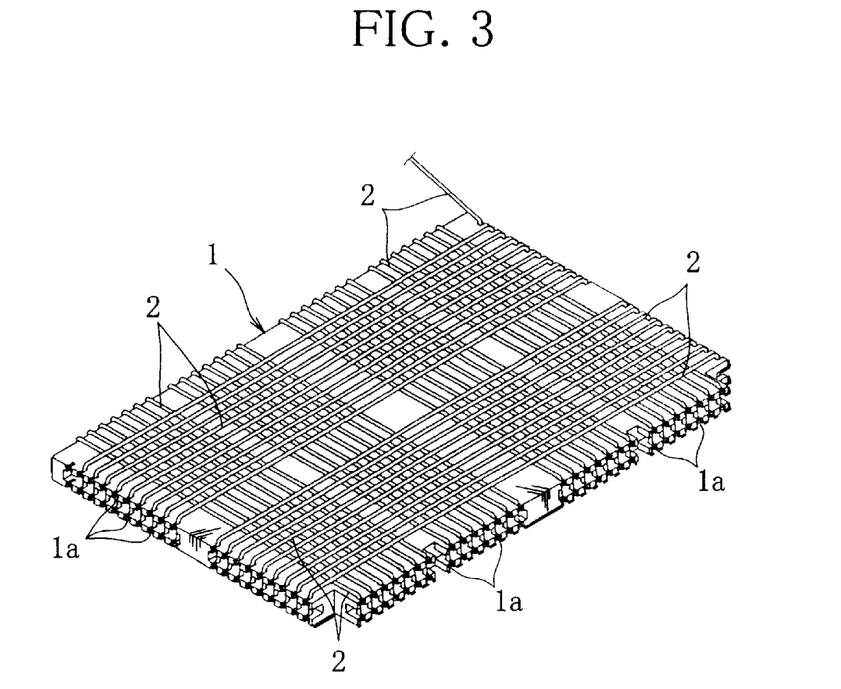
FIG. 3 is a perspective view showing electric wires wound around the insulating plate in FIG. 1 in a second direction.

Next, the electric wires 2 are wound around the insulating plate 1 in the lengthwise direction perpendicularly to the previously wound electric wires 2 by using the multiple retaining grooves 1a on the short sides, as shown in FIG. 3. At the time of wiring the electric wires 2 around the insulating plate 1, the insulating plate 1 is rotated while sequentially holding the centers of the long sides and short sides of the insulating plate 1 by the holding member of an unillustrated rotating apparatus.

Figure 4:
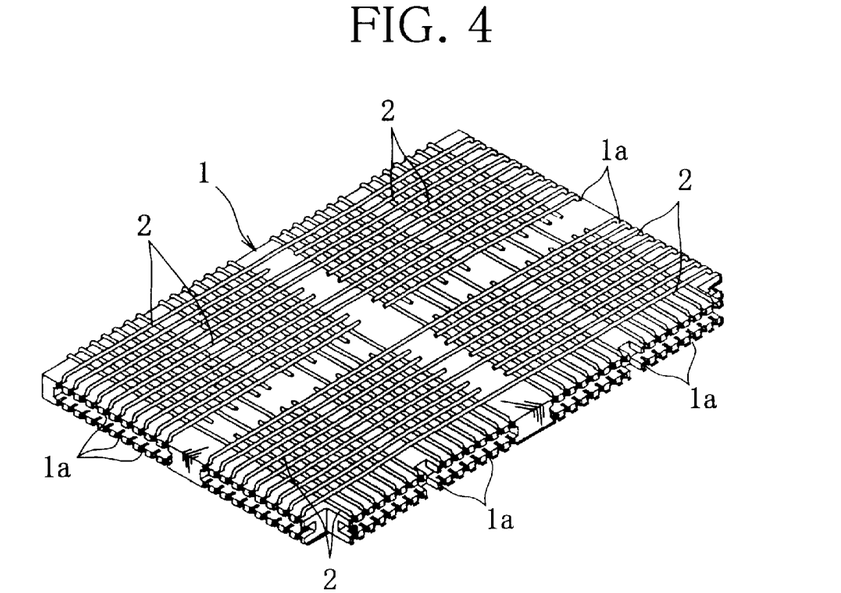
FIG. 4 is a perspective view of the insulating plate on which the wound electric wires are cut at a desired position.

Then, the wound electric wires 2 are cut at proper positions so as to form a desired circuit as shown in FIG. 4.

Figure 5:
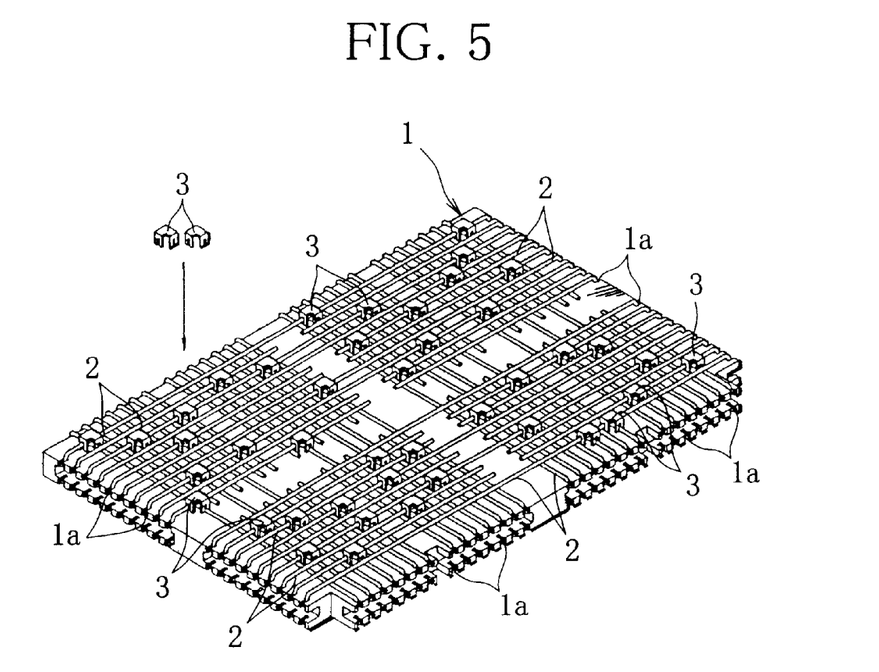
FIG. 5 is a perspective view of the insulating plate in FIG. 4 showing the state where pressure-contacting terminals are attached to the intersections of the electric wires to connect the electric wires together.

Thereafter, the joint type pressure-contacting terminals 3 are attached to desired positions where the electric wires 2 cross one another as shown in FIG. 5. This allows the crossed electric wires 2 to be electrically connected together by the pressure-contacting terminals 3.

Figure 6:
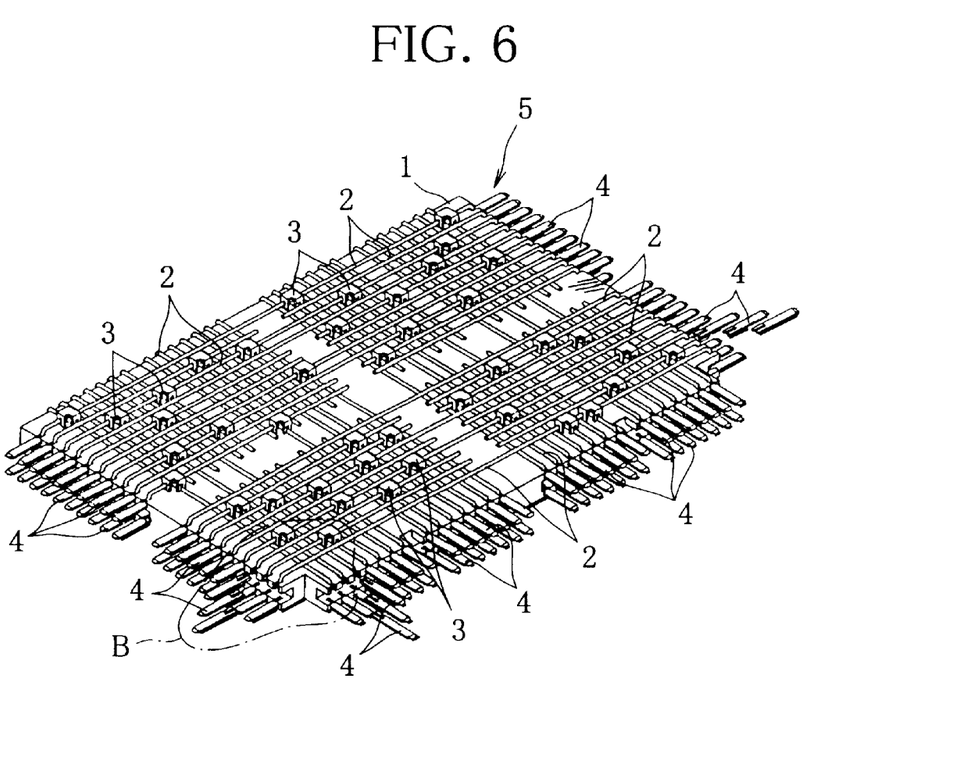
FIG. 6 is a perspective view showing the state where pressure-contacting terminals are attached to terminal grooves of the insulating plate in FIG. 5.
Figure 7:
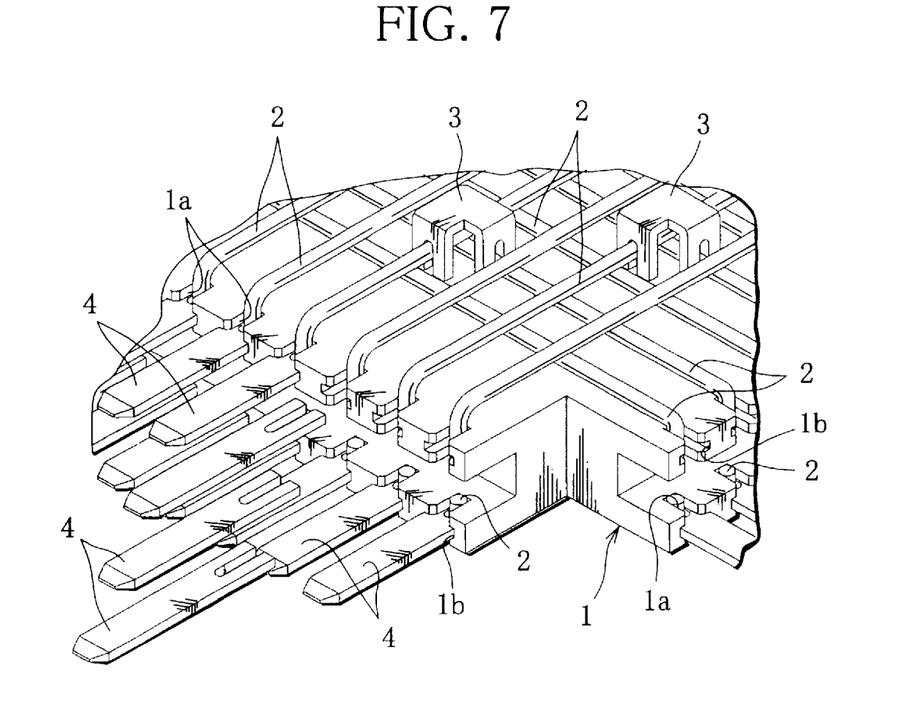
FIG. 7 is a perspective view showing a portion B of the insulating plate in FIG. 6 in enlargement.

As shown in FIGS. 6 and 7, a male type pressure-contacting terminals 4 are attached to the respective terminal grooves 1*b*, thereby completing the production of a wiring board 5.

As apparent from the above, because the method of this invention does not use bus bars that require molds, it is possible to reduce the cost that would be increased by otherwise required construction of molds for the bus bars, and to manufacture the wiring board at a low cost. As the electric wires 2 are cut at the proper positions and the joint type pressure-contacting terminals 3 are attached to the desired positions where the electric wires 2 cross one another, the wiring board 5 can easily be adapted to a change in circuit design.

Figure 9:
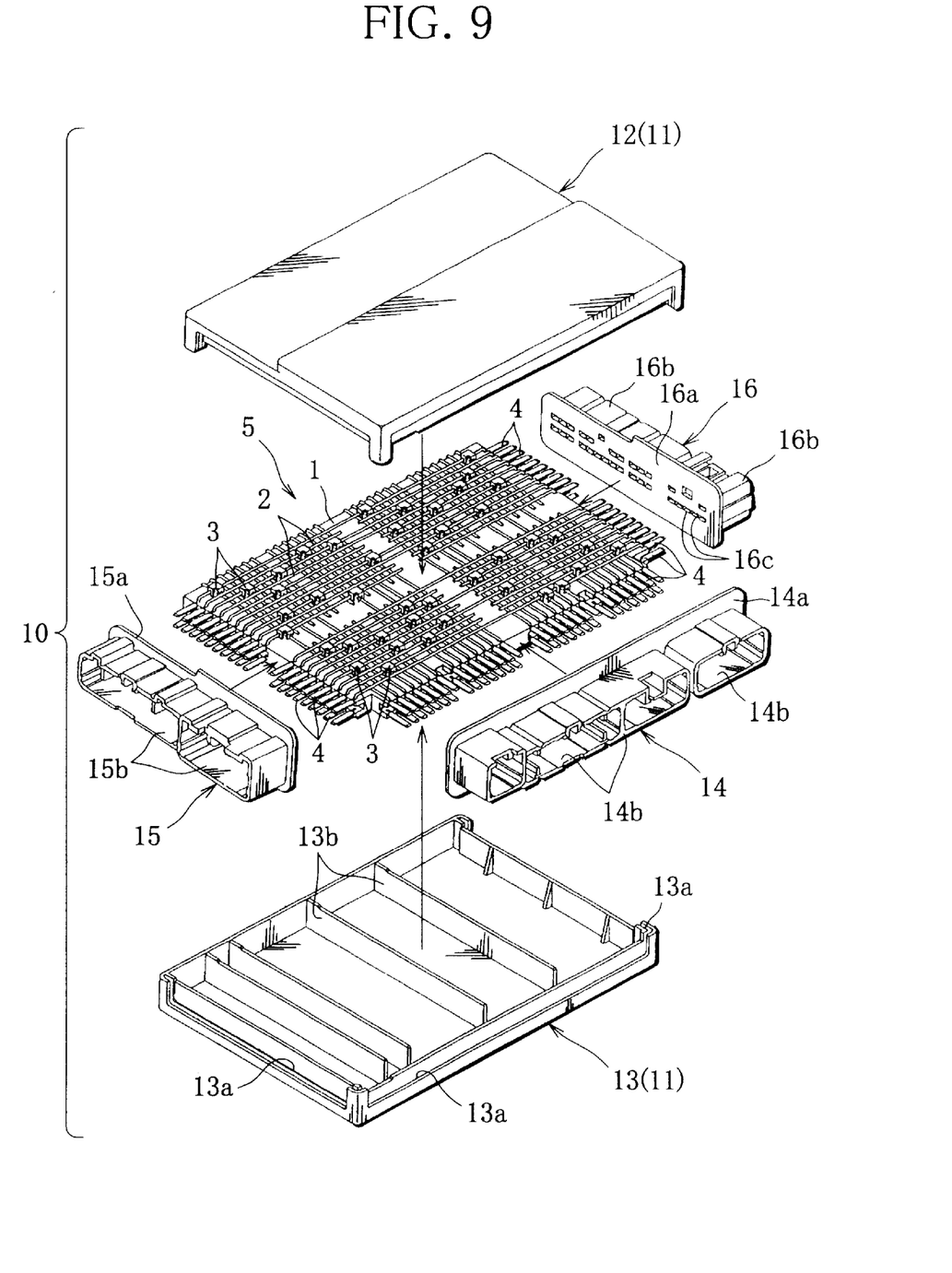
FIG. 9 is an exploded perspective view depicting how to assemble an electric connection box using the wiring board in FIG. 6.

The wiring board 5 manufactured in the above manner is housed in a case 11, which has an upper case 12 and a lower case 13 that are to be fitted together, thereby yielding an electric connection box 10 as shown in FIG. 9. At this time, as illustrated, connector covers 14 to 16 are attached to the outer surfaces of the upper case 12 and the lower case 13 of the electric connection box 10.

The upper case 12 and the lower case 13 are formed to have flat rectangular box shapes and grooves 12*a* and 13*a* in which the connector covers 14 to 16 are attached are respectively provided in the peripheries of those cases 12 and 13. Ribs 12*b* and 13*b* are formed inside the upper case and the lower case, respectively.

The connector covers 14 to 16 have a plurality of connector housings 14*b* to 16*b* of rectangular cylindrical shapes respectively formed on base plates 14*a* to 16*a*. Formed in the base plates 14*a* to 16*a* are a plurality of terminal holes 14*c* to 16*c* in which the multiple pressure-contacting terminals 4 of the wiring board 5 are inserted.

As the grooves 12*a* and ribs 12*b* of the upper case 12 and the terminal holes 14*c* and 15*c* of the connector covers 14 and 15 cannot be seen in the perspective view of FIG. 9, they are not illustrated.

The electric connection box 10 having the above-described structure is manufactured in the following manner.

First, the lower edges of the base plates 14*a* to 16*a* are fitted in the grooves 13*a* of the lower case 13, and the multiple pressure-contacting terminals 4 of the wiring board 5 are inserted into the respective terminal holes 14*c* to 16*c* formed in the base plates 14*a* to 16*a* so that the wiring board 5 is installed inside the lower case 13.

Figure 8:
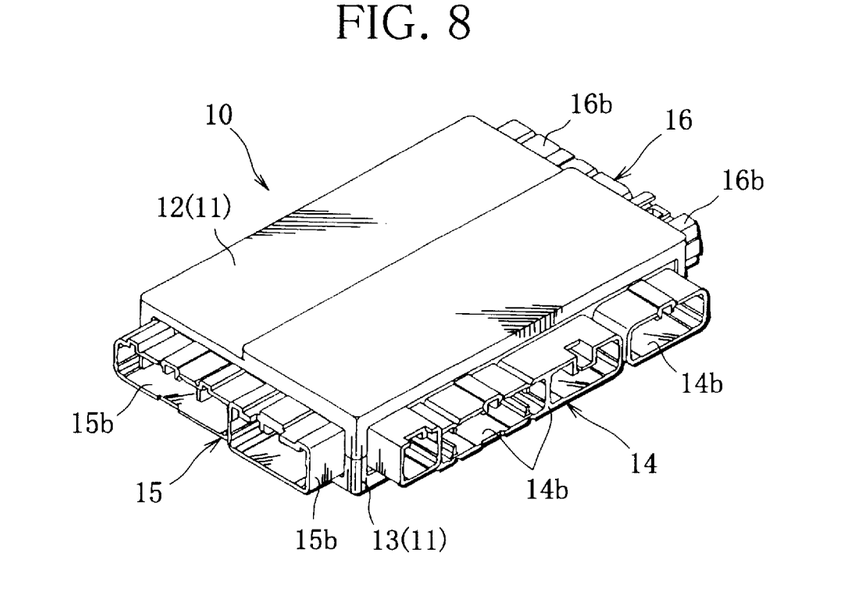
FIG. 8 is a perspective view of an electric connection box using the wiring board in FIG. 6 which has been manufactured by the method of this invention.

Next, the upper case 12 is fitted over the lower case 13 in which the wiring board 5 is installed, and the upper edges of the base plates 14*a* to 16*a* are fitted in the grooves 12*a* so that the upper case 12 and the lower case 13 are fitted together, thus completing the production of the electric connection box 10 shown in FIG. 8.

At this time, as the electric connection box 10 uses the flat wiring board 5 which does not use bus bars, the electric connection box 10 can be produced at a low cost. Further, as the electric wires 2 are cut at the proper positions and the joint type pressure-contacting terminals 3 are attached to the desired positions where the electric wires 2 cross one another, the wiring board 5 can easily be adapted to a change in circuit design.

Figure 10:
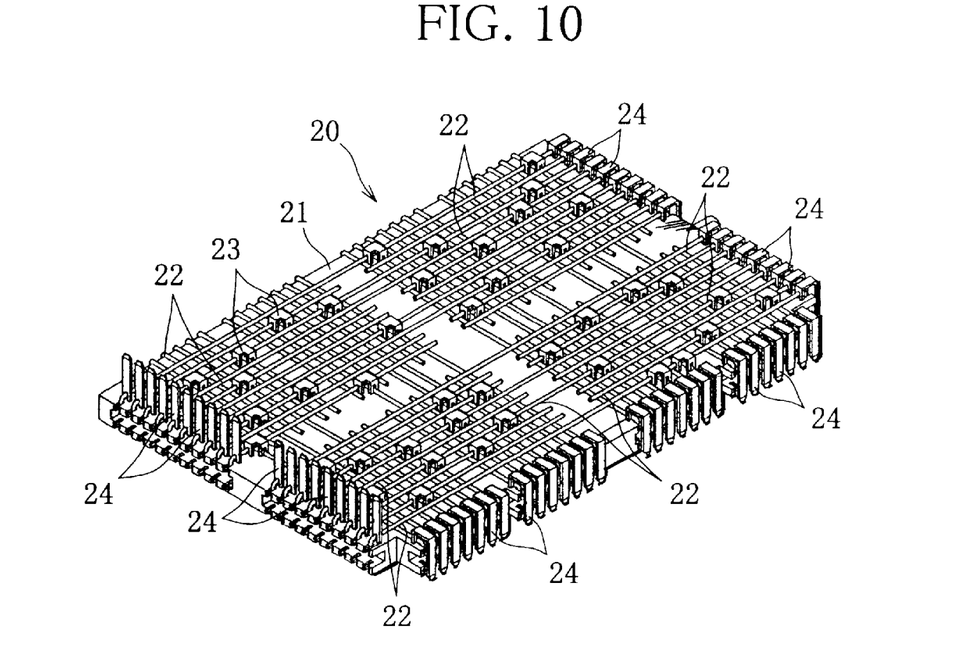
FIG. 10 is a perspective view showing another embodiment of the wiring board of this invention.

The wiring board may be manufactured by a different method which is used to produce a wiring board 20 shown in FIG. 10. Electric wires 22 are wound around an insulating plate 21, which is constructed in the same way as the insulating plate 1, in the widthwise direction and lengthwise direction. Then, the electric wires 22 are cut at the desired positions and joint type pressure-contacting terminals 23 are attached to the desired positions where the electric wires 22 cross one another. Then, the crossed electric wires 22 are electrically connected together by the pressure-contacting terminals 23, and pressure-contacting terminals 24 protruding upward and downward from the plate's top and bottom surfaces are attached to the insulating plate 21. This wiring board 20 can demonstrate the same advantages as the wiring board 5.

Figure 11:
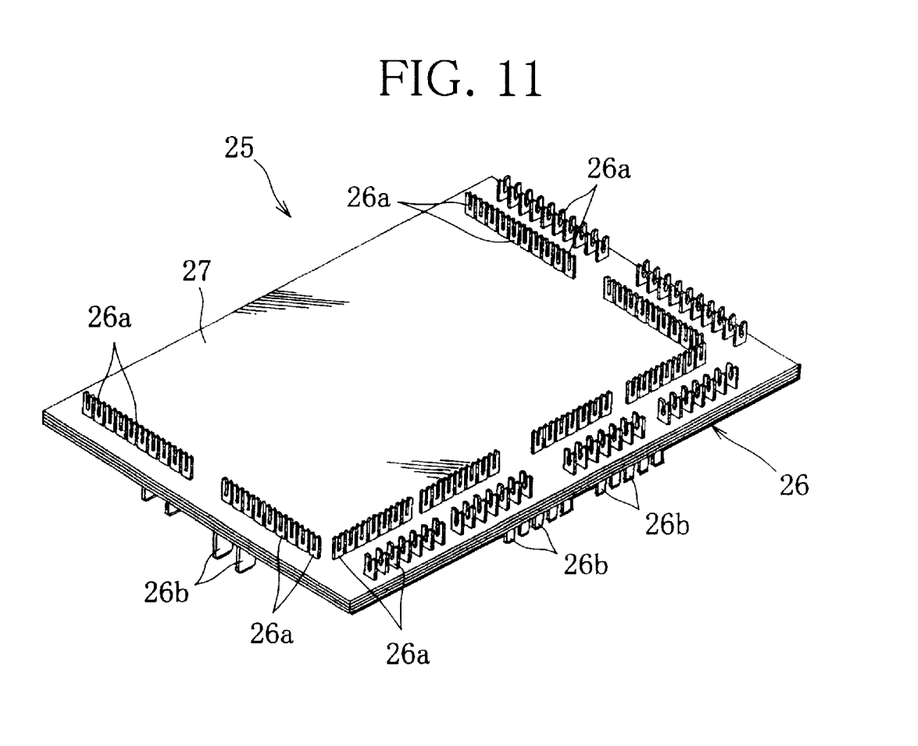
FIG. 11 is a perspective view of a bus-bar laminated member to which the wiring board in FIG. 10 is to be installed.

As the wiring board 20 is mounted on a bus-bar wiring member 25 which has a plurality of bus bars 26 and insulating plates 27 shown in FIG. 11, the desired bus bars can be electrically connected together by the electric wires 22.

At this time, each individual bus bar 26 is formed into a desired shape in consideration of the circuit pattern and has a plurality of pressure-contacting terminals 26*a* and tab terminals 26*b* which protrude upward and downward from the associated insulating plate 27.

Therefore, as the wiring board 20, installed on the bus-bar wiring member 25, is accommodated in the case which has unillustrated upper and lower cases, an electric connection box which can demonstrate the same advantages as the electric connection box 10 can be produced easily.

Figure 12:
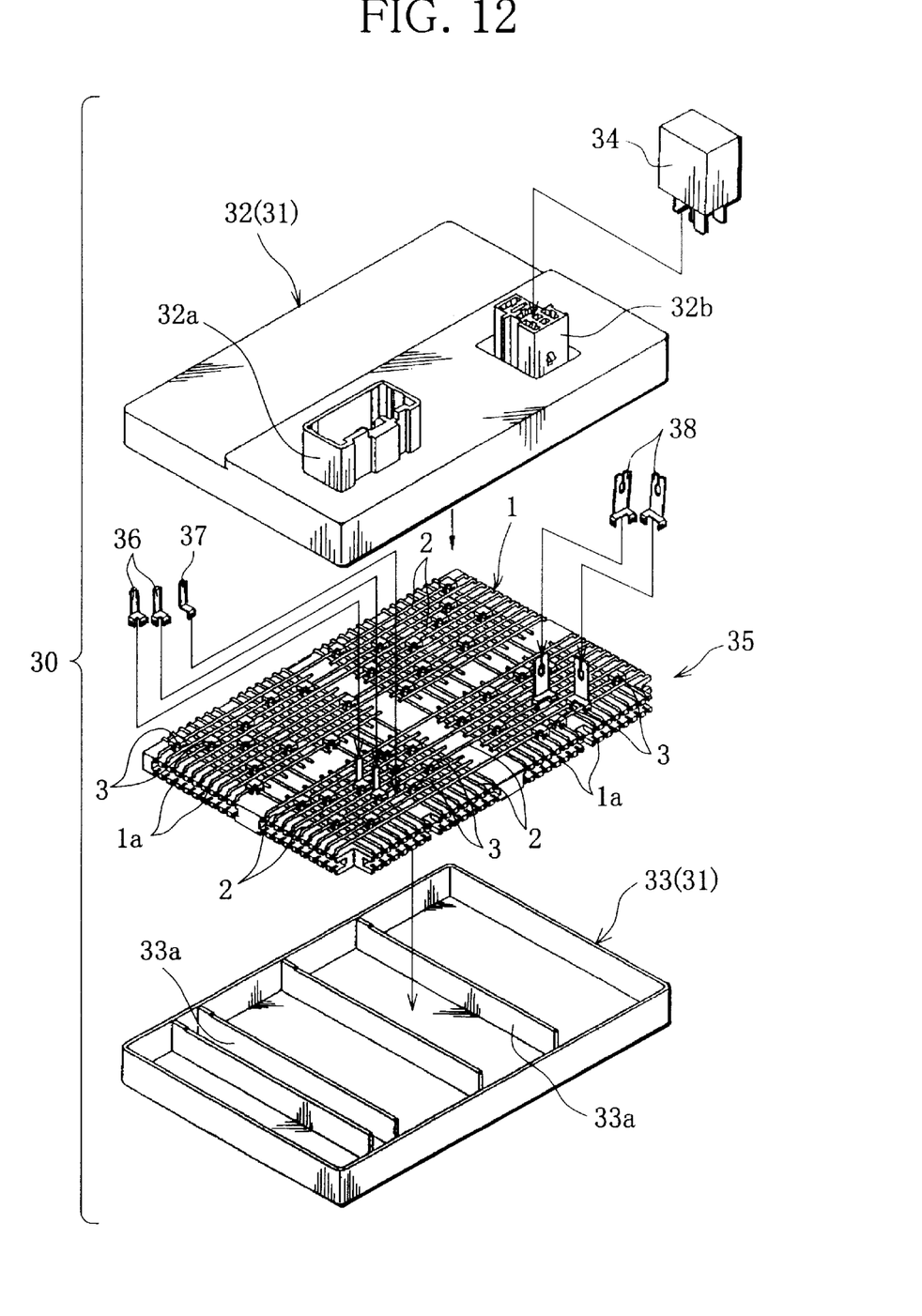
FIG. 12 is an exploded perspective view showing another embodiment of the electric connection box of this invention.

The electric connection box of this invention, if constructed like an electric connection box 30 shown in FIG. 12 which has a wiring board 35 housed in a case 31 having an upper case 32 and a lower case 33, can demonstrate the same advantages as the electric connection box 10.

The upper case 32 and lower case 33 are formed to have flat rectangular box shapes. As illustrated, the upper case 32 has a connector housing 32*a* and a connection housing 32*b* provided on the top. The connector housing 32*a* is to be connected to a desired connector. An electronic part 34, such as a relay, fuse, capacitor, diode or an electronic control unit (ECU), is to be connected to the connection housing 32*b*. A plurality of ribs 33*a* are formed inside the lower case 33.

Like the wiring board 5, the wiring board 35 is manufactured by winding the electric wires 2 around the insulating plate 1 which has multiple retaining grooves 1*a* and terminal grooves 1*b* (see FIGS. 2 and 7) formed at predetermined pitches. At this time, the electric wires 2 are wound around the insulating plate 1 by rotating the insulating plate 1 in the lengthwise direction and the widthwise direction while sequentially holding the centers of the long sides and short sides of the insulating plate 1 by the holding member of an unillustrated rotating apparatus. The wound electric wires 2 are cut at proper positions so as to form a desired circuit.

Then, in the wiring board 35, as illustrated, the joint type pressure-contacting terminals 3 are attached to proper positions where the electric wires 2 cross one another, pressure-contacting terminals 36 and 37 are attached to the positions that correspond to the connector housing 32*a* and pressure-contacting terminals 38 are attached to the positions that correspond to the connection housing 32*b*. Therefore, the pressure-contacting terminals 36 and 37 are connected to a connector connected to the connector housing 32*a*, and the pressure-contacting terminals 38 are connected via the connection housing 32*b* to the electronic part 34.

Although the rectangular insulating plates 1 and 21 are used in the wiring boards 5 and 20 in the above-described embodiments, the insulating plate is not limited to this shape but may take various other shapes than the rectangular shape, such as one having corners or a part cut away, in accordance with the usage.

Figure 13:
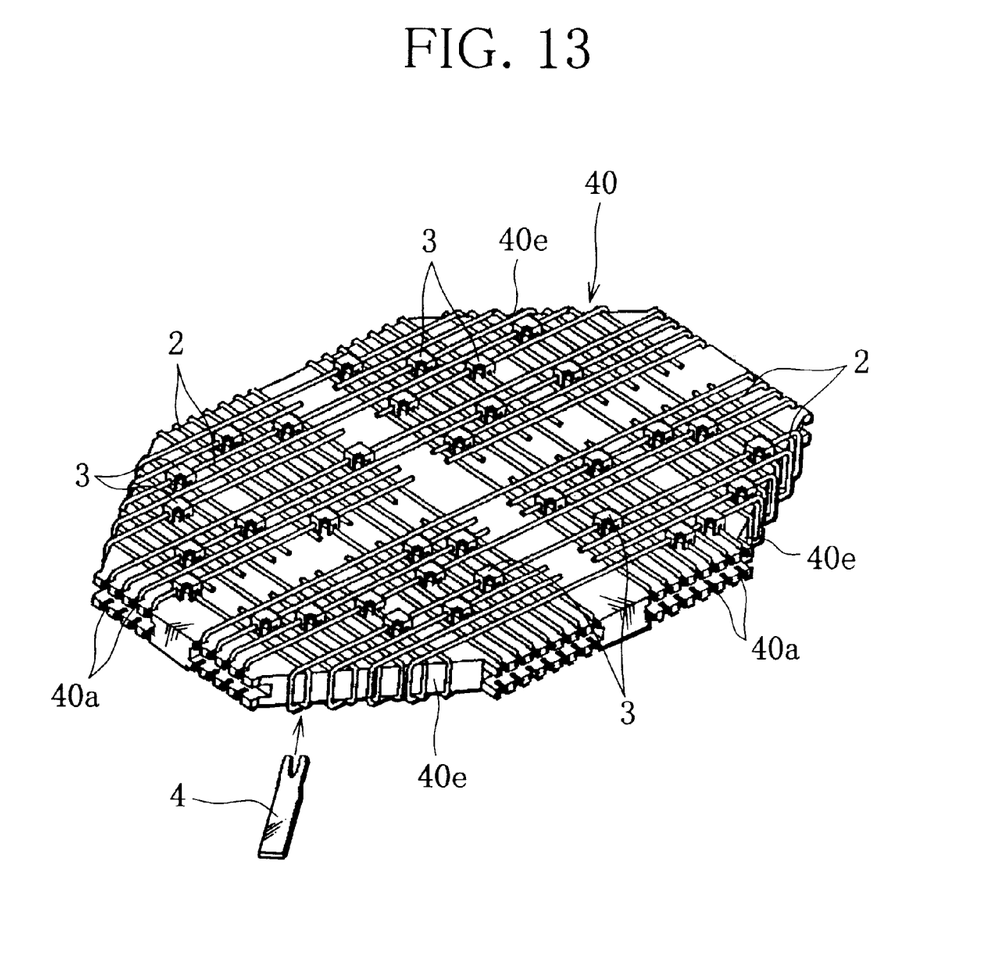
FIG. 13 is a perspective view showing a further embodiment of the wiring board of this invention.

For example, the corners of a rectangular insulating plate may be cut away as done for a wiring board 40 shown in FIG. 13, and the retaining grooves and terminal grooves (neither shown) having the same structures as those of the wiring board 5 are provided on oblique sides 40e. Then, the pressure-contacting terminals 4 are attached to the terminal grooves and an unillustrated connector is connected to this wiring board 40 from outside and the oblique direction. This wiring board 40 can still demonstrate the same advantages as the wiring boards 5 and 20 of the above-described embodiments.

The wiring board 40 has multiple retaining grooves 40a for retaining electric wires 2, formed in the periphery at predetermined pitches, and terminal grooves (not shown) to which pressure-contacting terminals 3 are to be attached are provided in the respective retaining grooves 40a. Further, in the wiring board 40, as illustrated, the joint type pressure-contacting terminals 3 are attached to the proper positions where electric wires 2 cross one another.

According to the wiring-board manufacturing method of this invention, wiring may be accomplished by fixing the insulating plate 1 or 21 or the wiring board 40 and moving the electric wire side to wind the electric wire around the insulating plate or the wiring board.

What is claimed is:

1. A method of manufacturing a wiring board comprising the steps of:

winding electric wires around an insulating plate in first and second directions different from each other;

cutting said electric wires at a first desired position;

connecting said electric wires at a second desired position where said electric wires cross each other; and attaching a connecting terminal to said electric wires at a third desired position.

2. The method according to claim 1, wherein said insulating plate is formed of polypropylene or polybutylene terephthalate which has an electric insulating property.

3. The method according to claim 1, wherein said insulating plate has multiple retaining grooves for retaining electric wires, formed in a periphery at predetermined pitches, and terminal grooves, respectively provided in said retaining grooves, to which pressure-contacting terminals are to be attached.

4. The method according to claim 2, wherein said insulating plate has multiple retaining grooves for retaining electric wires, formed in a periphery at predetermined pitches, and terminal grooves, respectively provided in said retaining grooves, to which pressure-contacting terminals are to be attached.

5. An electric connection box manufactured by housing a wiring board manufactured by the method as set forth in claim 1 in a case.

6. The electric connection box according to claim 5, wherein said case has an upper case and a lower case.

* * * * *